United States Patent
Manohar et al.

(10) Patent No.: US 9,651,620 B2
(45) Date of Patent: May 16, 2017

(54) MEASUREMENTS CIRCUITRY AND METHOD FOR GENERATING AN OSCILLATING OUTPUT SIGNAL USED TO DERIVE TIMING INFORMATION

(71) Applicant: ARM LIMITED, Cambridge (GB)

(72) Inventors: Ramesh Manohar, Bangalore (IN); James Dennis Dodrill, Dripping Springs, TX (US)

(73) Assignee: ARM Limited, Cambridge (GB)

( * ) Notice: Subject to any disclaimer, the term of this patent is extended or adjusted under 35 U.S.C. 154(b) by 228 days.

(21) Appl. No.: 14/531,512

(22) Filed: Nov. 3, 2014

(65) Prior Publication Data
US 2016/0124045 A1  May 5, 2016

(51) Int. Cl.
G01R 27/28 (2006.01)
G01R 31/3183 (2006.01)
H03K 3/03 (2006.01)

(52) U.S. Cl.
CPC ... *G01R 31/318328* (2013.01); *H03K 3/0315* (2013.01)

(58) Field of Classification Search
CPC ............ G01R 31/318328; G01R 27/28; H03K 3/0315
USPC ....... 324/434, 436, 135, 139, 532, 535, 617, 324/618; 702/1, 57, 79, 127, 149, 176, 702/178; 361/73
See application file for complete search history.

(56) References Cited

U.S. PATENT DOCUMENTS 5,537,098 A    7/1996  Patrick et al.
6,499,334 B1 * 12/2002  Kobayashi ......... G01R 31/3016
                                              73/1.42
(Continued)

OTHER PUBLICATIONS

Teh et al., "A 77% Energy-Saving 22-Transistor Single-Phase-Clocking D-Flip-Flop with Adaptive-Coupling Configuration in 40nm CMOS", *ISSCC 2011 /Session 19/ Low-Power Digital Techniques*, 19.4, 2011, pp. 338-340.

(Continued)

*Primary Examiner* — Son Le
*Assistant Examiner* — Alvaro Fortich
(74) *Attorney, Agent, or Firm* — Pramudji Law Group PLLC; Ari Pramudji

(57) ABSTRACT

A measurement circuit and method is provided for generating an oscillating output signal used to derive timing information. The measurement circuit includes a ring oscillator having a plurality of unit cells, where each unit cell comprises at least a storage element whose output signal is used to determine a clock input signal for an adjacent unit cell within the ring oscillator. Control circuitry performs a control operation to control either a set function or a reset function of the storage element in each of the unit cells, in dependence on set or reset signals input to the control circuitry. Oscillation initiation circuitry is used to assert a clock input signal to the storage element in a first unit cell in order to initiate generation of the oscillating output signal, and the control circuitry then performs the control operation in order to control a value of the output signal of the storage element in each unit cell so as to cause the oscillating output signal to be maintained. Such an approach provides a particularly simple and efficient mechanism for deriving timing information for various circuit blocks that include a storage element.

25 Claims, 15 Drawing Sheets

(56) References Cited

U.S. PATENT DOCUMENTS

| | | | |
|---|---|---|---|
| 7,477,112 B1 | 1/2009 | Pi et al. | |
| 2010/0134169 A1* | 6/2010 | Okubo | G11C 7/1066 327/263 |
| 2011/0109355 A1* | 5/2011 | Sakaguchi | H03L 7/0814 327/157 |
| 2011/0255353 A1* | 10/2011 | Fukushima | G01R 31/2874 365/191 |
| 2012/0119800 A1* | 5/2012 | Yamasaki | H03L 7/183 327/142 |
| 2015/0226800 A1* | 8/2015 | Kim | H03K 3/0315 702/79 |

OTHER PUBLICATIONS

Nedovic et al., "A Test Circuit for Measurement of Clocked Storage Element Characteristics", *IEEE Journal of Solid-State Circuits*, vol. 39, No. 8, Aug. 2004, pp. 1294-1304.

Duong, "Circuits for Measurement of Flip-Flop Performance Variability", Research Project, Submitted to the Department of Electrical Engineering and Computer Sciences, University of California at Berkeley, 45 pages.

Ribas et al., "Performance and Functional Test of Flip-Flops Using Ring Oscillator Structure", Federal University of Rio Grande do Sul- Brazil, IEEE, 978-1-0469-6/11, 2011, pp. 42-47.

Ribas et al., "Ring Oscillators for Functional and Delay Test of Latches and Flip-Flops", SBCCI'II, Aug. 30-Sep. 2, 2011, pp. 67-72.

* cited by examiner

ALTERNATIVE CONNECTIONS TO ACCOUNT FOR FLIP-FLOP SETUP TIME

MEASUREMENTS CIRCUITRY AND METHOD FOR GENERATING AN OSCILLATING OUTPUT SIGNAL USED TO DERIVE TIMING INFORMATION

BACKGROUND

Field

The present technique relates to a measurement circuit and method for generating an oscillating output signal used to derive timing information.

Description of the Prior Art

There are many situations where it is useful to be able to determine timing information in relation to certain circuit blocks used within data processing systems. Often such circuit blocks will include a sequential storage element, for example a flip-flop. The circuit block may in some instances be the sequential storage element itself, or alternatively may comprise the sequential storage element along with some associated circuitry, such as some combinatorial logic circuits used to process the output of the sequential storage element.

For example, when designing a standard cell library, a standard cell representing a flip-flop may be designed, and it is often useful to determine certain timing information in relation to the flip-flop, for example the clock-to-Q delay of the flip-flop. As another example situation where it is useful to derive timing information for a circuit block, an integrated circuit will typically include one or more critical path circuit blocks, where a signal output from a sequential storage element may then be processed through some combinatorial logic circuits in the critical path prior to the output then being stored in a subsequent sequential storage element. It is often useful to be able to measure the time taken to process signals through such a critical path, as this can affect certain operating parameters, such as the operating frequency at which the integrated circuit can be run.

It would be desirable to provide improved techniques for deriving timing information of circuit blocks such as those discussed above.

SUMMARY

Viewed from a first aspect, there is provided measurement circuitry for generating an oscillating output signal used to derive timing information, the measurement circuitry comprising: a ring oscillator comprising a plurality of unit cells, each unit cell comprising at least a storage element whose output signal is used to determine a clock input signal for an adjacent unit cell of said plurality of unit cells within the ring oscillator; control circuitry capable of performing a control operation to control one of a set function and a reset function of the storage element in each of said plurality of unit cells in dependence on set and reset signals input to the control circuitry; and oscillation initiation circuitry capable of causing assertion of the clock input signal to the storage element of a first one of said plurality of unit cells upon receipt of an asserted oscillation enable signal, in order to initiate generation of the oscillating output signal; the control circuitry being capable of performing the control operation after the generation of the oscillating output signal is initiated in order to control a value of the output signal of the storage element in each unit cell so as to cause the oscillating output signal to be maintained.

Viewed from a second aspect, there is provided an integrated circuit comprising: processing circuitry incorporating at least one critical path circuit block; measurement circuitry in accordance with the first aspect, wherein each unit cell comprises a copy of one of said at least one critical path circuit blocks connected to the output signal of the storage element, and with the output of said copy being used to determine the clock input signal for an adjacent unit cell of said plurality of unit cells within the ring oscillator; and operating parameter control circuitry capable of controlling an operating parameter of the processing circuitry in dependence on a frequency of the oscillating output signal generated by the measurement circuitry.

Viewed from a third aspect, there is provided a method of generating an oscillating output signal used to derive timing information, comprising: forming a ring oscillator comprising a plurality of unit cells, each unit cell comprising at least a storage element whose output signal is used to determine a clock input signal for an adjacent unit cell of said plurality of unit cells within the ring oscillator; performing a control operation to control one of a set function and a reset function of the storage element in each of said plurality of unit cells in dependence on set and reset signals input to the control circuitry; and asserting the clock input signal to the storage element of a first one of said plurality of unit cells in response to an asserted oscillation enable signal, in order to initiate generation of the oscillating output signal; the performance of the control operation after the generation of the oscillating output signal is initiated controlling a value of the output signal of the storage element in each unit cell so as to cause the oscillating output signal to be maintained.

Viewed from a fourth aspect, there is provided measurement circuitry for generating an oscillating output signal used to derive timing information, the measurement circuitry comprising: ring oscillator means comprising a plurality of unit cell means, each unit cell means comprising at least a storage element means whose output signal is used to determine a clock input signal for an adjacent unit cell means of said plurality of unit cell means within the ring oscillator means; control means for performing a control operation to control one of a set function and a reset function of the storage element means in each of said plurality of unit cell means in dependence on set and reset signals input to the control means; and oscillation initiation means for causing assertion of the clock input signal to the storage element means of a first one of said plurality of unit cell means upon receipt of an asserted oscillation enable signal, in order to initiate generation of the oscillating output signal; the control means for performing the control operation after the generation of the oscillating output signal is initiated in order to control a value of the output signal of the storage element means in each unit cell means so as to cause the oscillating output signal to be maintained.

BRIEF DESCRIPTION OF THE DRAWINGS

The present technique will be described further, by way of example only, with reference to embodiments thereof as illustrated in the accompanying drawings, in which.

DESCRIPTION OF EMBODIMENTS

Figure 1:
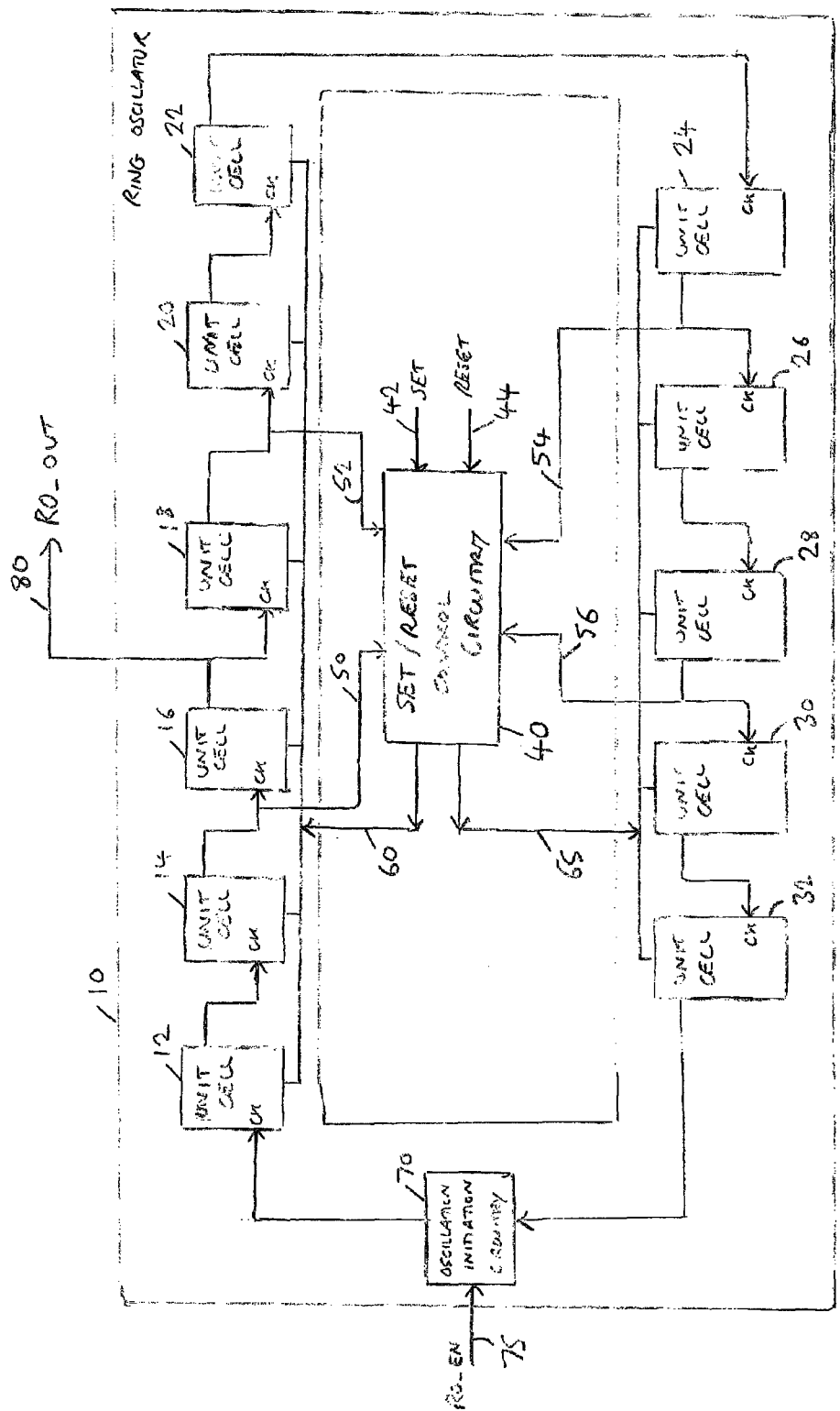
FIG. 1 is a block diagram of measurement circuitry in accordance with the described embodiments.

Before discussing the embodiments with reference to the accompanying figures, the following description of embodiments and associated advantages is provided.

In accordance with one embodiment, a measurement circuit is provided that contains a ring oscillator formed of a plurality of unit cells, where each unit cell has at least a storage element therein. The output signal from the storage element from one unit cell is used to produce a clock input signal for an adjacent unit cell in the ring oscillator. Control circuitry is then provided to control either the set function or the reset function of the storage elements in the unit cells, based on both set and reset signals input to the control circuitry. Oscillation initiation circuitry is used to initiate generation of an oscillating output signal by the measurement circuitry, and the control circuitry then controls either the set function or the reset function of the storage elements in the ring oscillator in order to control the value of the output signals of the various storage elements so as to ensure that an oscillating output signal continues to be maintained. Desired timing information can then be derived from the oscillating output signal, typically with reference to the period of oscillation of that oscillating output signal.

The above approach has been found to provide a particularly simple and efficient mechanism for deriving timing information of circuit blocks that include a storage element. In particular, such measurement circuitry can be made relatively small, hence reducing power consumption and leakage current associated with the measurement circuitry, whilst enabling accurate timing information to be determined. Further, since the circuit is small, this circuit can be implemented close to critical paths, in order to improve the accuracy of measurement. Further, the circuit can be implemented at multiple locations within an integrated circuit in order to monitor on-chip variation (different areas within a device potentially having variations introduced by manufacturing process, temperature variation and/or voltage drop).

In addition to controlling the value of the output signal of the storage elements in the ring oscillator so as to ensure that an oscillating output signal can continue to be maintained, the control circuitry can also be arranged to set up initial values for the output signals of the storage elements in each unit cell prior to the oscillating output signal generation being initiated, thereby ensuring that the output signal values are at the appropriate levels to begin initiation of the oscillating output signal.

In one embodiment, the ring oscillator is considered as consisting of multiple portions, each portion typically comprising multiple unit cells. In one such embodiment, the control circuitry is capable of generating separate control signals for each of the multiple portions, so as to enable the set function or the reset function to be controlled independently for the storage elements of the unit cells in different portions of the ring oscillator.

In one particular embodiment, the ability of the control circuitry to control the set function or reset function independently for the unit cells in the different portions of the ring oscillator is used after generation of the oscillating output signal has been initiated in order to control the values of the output signals of the storage elements in a way that ensures that the oscillating output signal can be maintained.

In one embodiment, it is not necessary for the control circuitry to independently control the set function or the reset function during the initial set up phase prior to generation of the oscillating output signal being initiated, and instead the initial value of the output signal of the storage element in each unit cell throughout the ring oscillator can be controlled using the same control signals.

The number of portions into which the ring oscillator is divided can vary dependent on embodiment, but in one particular embodiment the ring oscillator is considered to consist of two portions that can be independently controlled by the control circuitry.

The control circuitry can take a variety of forms but in one embodiment comprises a storage element for each of the multiple portions, whose set and reset functions are controlled by the set and reset signals input to the control circuitry, and whose output signal is used to control either the set function or the reset function of the storage elements of the unit cells in a corresponding portion of the ring oscillator. Hence, considering the particular example where the ring oscillator is considered to consist of two portions, a first storage element within the control circuitry will generate an output signal used to control either the set function or the reset function of the storage elements of the unit cells within the first portion of the ring oscillator, whilst a second storage element within the control circuitry will be arranged such that its output signal controls the set function or the reset function of the storage elements of the unit cells in the second portion of the ring oscillator.

In one embodiment, each storage element in the control circuitry is not only controlled by the set and reset signals input to the control circuitry, but also is controlled in dependence on further control inputs derived from output signals associated with storage elements of predetermined unit cells in the associated portion of the ring oscillator. This provides a particularly efficient mechanism for controlling the output values of the storage elements in the various unit cells of the ring oscillator in order to enable the oscillating output signal to be maintained.

In one embodiment, whichever one of the set function and the reset function of the storage element in each of said plurality of unit cells is controlled by the control circuitry, the storage element in multiple but not all of said plurality of unit cells is arranged to have the other of the set function and the reset function disabled. Hence, if the control circuitry controls the set function of the storage elements in the unit cells of the ring oscillator, the reset function of multiple of those storage elements will be disabled. Conversely, if the control circuitry controls the reset function of the storage element in each of the unit cells of the ring oscillator, then the set function of multiple of those storage elements will be disabled.

However, in one embodiment, for at least one of the storage elements in the ring oscillator the other of the set function and the reset function is not disabled. In particular, in one embodiment, the storage element in one of the plurality of unit cells is arranged to have the other of the set function and the reset function controlled by the appropriate one of the set signal and the reset signal input to the control circuitry. This approach can be used to ensure that the appropriate arrangement of output signal values is present within the ring oscillator to begin oscillation in the output signal when triggered by the oscillation initiation circuitry.

In particular, in one embodiment, the oscillation initiation circuitry is configured to gate the output signal from the storage element in said one of the plurality of unit cells such that that output signal is used to determine the clock input signal to the storage element of the first one of said plurality of unit cells upon receipt of the asserted oscillation enable signal. Hence, on receipt of the asserted oscillation enable signal, in this embodiment the oscillation initiation circuitry allows the output signal from the storage element in said one of the plurality of unit cells to drive the clock input to the storage element in the first one of the plurality of unit cells, causing that first one of the plurality of unit cells to receive an asserted clock signal, and hence begin generation of the oscillating output signal.

In one embodiment, the storage unit in each unit cell has its data input set to a predetermined value during generation of the oscillating output signal. In one embodiment, this can be achieved by tying those data inputs to a predetermined voltage level. Alternatively, some of the circuitry within each unit cell may be used to generate an output which primes the data input for the storage element in the next unit cell to the required predetermined value when the oscillating output signal is being generated.

In one embodiment, to improve the consistency in the timing of signal propagation through each of the unit cells, it is useful to include components to ensure that the output signal from each unit cell has a uniform loading. In one embodiment, this is achieved by arranging each unit cell to include loading circuitry to apply a load on the output signal from the storage element. The loading circuitry can take a variety of forms, and may for example be constructed from inverters or buffers.

The storage elements within the ring oscillator can take a variety of forms, but in one embodiment are sequential storage elements, for example flip-flops. In one particular embodiment, the timing information derived from the oscillating output signal is a clock-to-Q delay of the flip-flop. The measurement circuitry of the described embodiment provides a particularly simple and effective mechanism for measuring such a clock-to-Q delay of a flip-flop.

The clock-to-Q delay of a flip-flop may vary dependent on whether the value of the output signal at the Q output is falling or rising. In one embodiment, the measurement circuitry can be configured so as to specifically measure either the falling clock-to-Q delay or the rising clock-to-Q delay. In particular, in one embodiment, the storage unit in each unit cell has its data input set to a logic low value during generation of the oscillating output signal, and the timing information derived from the oscillating output signal is a falling clock-to-Q delay of the flip-flop. However, in an alternative embodiment, the storage unit in each unit cell has its data input set to a logic high value during generation of the oscillating output signal, and the timing information derived from the oscillating output signal is a rising clock-to-Q delay of the flip-flop.

Whilst each unit cell may essentially consist solely of the storage element, in an alternative embodiment each unit cell may include additional circuit elements. For example, in one embodiment, each unit cell comprises critical path circuitry connected to the output signal of the storage element, and the timing information derived from the oscillating output signal is a maximum operating frequency indication for an apparatus including the critical path circuitry. In particular, the maximum operating frequency can be determined based on the frequency of the oscillating output signal and an indication of the number of unit cells within the ring oscillator. Such a measurement circuit could be used in situ during operation of an integrated circuit including such critical path circuitry in one of its processing pipelines, where the measurement circuitry is also provided within the integrated circuit in order to provide real time information about the maximum operating frequency that can be employed within the integrated circuit having regards to the critical path.

Hence, in accordance with a further embodiment there is provided an integrated circuit comprising: processing circuitry incorporating at least one critical path circuit block; measurement circuitry in accordance with the one of the above described embodiments, wherein each unit cell comprises a copy of one of said at least one critical path circuit blocks connected to the output signal of the storage element, and with the output of said copy being used to determine the clock input signal for an adjacent unit cell of said plurality of unit cells within the ring oscillator; and operating parameter control circuitry capable of controlling an operating parameter of the processing circuitry in dependence on a frequency of the oscillating output signal generated by the measurement circuitry.

The operating parameter controlled by the operating parameter control circuitry can take a variety of forms, but in one embodiment is an operating frequency. Alternatively, it would be possible to use the information to vary other parameters such as an operating voltage. By such an approach, it is possible to take account of various effects within the integrated circuit, such as on-chip variation (in embodiments where the measurement circuitry is placed in multiple locations within the integrated circuit), voltage drop and temperature sensitivity.

In one embodiment, each unit cell comprises a copy of the same critical path circuit block. Such an approach can be used to take account of on-chip variation within the integrated circuit in respect of the particular critical path circuit block under consideration, allowing the operating parameter control circuitry to control the relevant operating parameter in dependence on the oscillating output signal.

However, in an alternative embodiment, where multiple critical path circuit blocks are included within the processing circuitry of the integrated circuit, each unit cell may comprise a copy of one of those multiple critical path circuit blocks, with different unit cells having copies of different ones of the critical path circuit blocks instantiated therein. As a result, each of the multiple critical path circuit blocks will have an associated copy in at least one of the unit cells of the ring oscillator. Such an approach would enable an oscillating output signal to be produced which represents a weighted average of the expected critical paths, with the operating parameter control circuitry then using that information in order to control an operating parameter of the processing circuitry.

In one embodiment, the copy of the critical path circuit block in one unit cell can be arranged so that its output is used to set a data input for an adjacent unit cell within the ring oscillator to a predetermined value during generation of the oscillating output signal. This can be used as an alternative approach to merely tying the data input of the storage element in each unit cell to a predetermined value, and enables account to be taken of the set-up time of the storage element.

In one embodiment, each unit cell may include a bypass path to selectably enable the copy of said at least one critical path circuit block in that unit cell to be bypassed. This enables timing data to be obtained both for the situation where the critical path circuitry is included in the ring oscillator, and for the situation where it is not.

In one embodiment, each unit cell may include copies of multiple critical path circuit blocks connected to the output signal of the storage element, and selection circuitry for selecting between those copies so that the output from one of those copies is used to determine the clock input signal for an adjacent unit cell of said plurality of unit cells within the ring oscillator. This enables multiple critical paths to be tested by the measurement circuitry.

Particular embodiments will now be described with reference to the figures.

FIG. 1 is a block diagram of measurement circuitry in accordance with the described embodiments. The measurement circuitry consists of a ring oscillator 10 consisting of a plurality of interconnected unit cells 12, 14, 16, 18, 20, 22, 24, 26, 28, 30, 32. Each unit cell includes at least a sequential storage element, and for the purposes of the following description it will be assumed that that sequential storage element is a flip-flop. Each unit cell may additionally include other components, such as loading circuits used to provide a load to the output signal of the flip-flop, and/or various combinatorial logic circuits such as the critical path circuitry that will be described further herein with reference to some of the later figures. The output signal generated from the flip-flop in each unit cell is used to determine a clock input signal for an adjacent unit cell in the ring oscillator. In the case where each unit cell includes other components, such as the earlier mentioned critical path circuitry, the output signal from the flip-flop may first be processed through that additional circuitry before being used to determine the clock input signal for the adjacent unit cell.

Set/reset control circuitry 40 is provided in association with the ring oscillator 10 and is used via paths 60, 65 to control either the set function or the reset function of the flip-flops in each of the unit cells. As can be seen from FIG. 1, in this example the ring oscillator is considered to consist of two portions, with the first portion containing the unit cells 12, 14, 16, 18, 20, 22 and the second portion containing the unit cells 24, 26, 28, 30, 32. The control signal issued other path 60 from the set/reset control circuitry 40 controls the set function or the reset function of the unit cells in the first portion, while the control signal 65 controls the set function or the reset function of the unit cells in the second portion. If the set/reset control circuitry 40 is used to control the set function of the unit cells, then typically the reset function of most (but not all) of the unit cells in the ring oscillator will be disabled. In one embodiment, the reset function of the final unit cell 32 is not disabled, as will be discussed in more detail later with reference to the particular embodiment of FIG. 2. Similarly, if the set/reset control circuitry 40 is used to control the reset function of the unit cells, then the set function of most (but not all) of the unit cells will be disabled. Again, in one embodiment, the set function of the final unit cell 32 is not disabled, as will be discussed in more detail later with reference to the example of FIG. 5.

As shown in FIG. 1, the set/reset control circuitry 40 is arranged to receive set and reset signals over paths 42, 44. It also receives various signals from predetermined unit cell outputs within the ring oscillator, as indicated by the control paths 50, 52, 54, 56. It uses all of these various inputs to control the logic level on the control paths 60, 65 so as to set the outputs from each of the flip-flops in the unit cells of the ring oscillator 10 to an appropriate initial value to enable an oscillating output signal over path 80 to begin to be generated when the operation of the ring oscillator 10 is triggered by the oscillation initiation circuitry 70 in response to an oscillation enable signal over path 75. Further, using its various input signals the set/reset control circuitry 40 can also generate appropriate signals over paths 60, 65 to continue to manipulate the outputs of the various flip-flops within the unit cells of the ring oscillator during operation of the ring oscillator, to ensure that an oscillating output signal can continue to be maintained over path 80. The operation of the set/reset control circuitry 40 will be described in more detail later with reference to the more particular embodiments described herein. The oscillation initiation circuitry 70 can take a variety of forms, but in one embodiment serves to gate the output from the unit cell 32 so that in the absence of an asserted oscillation enable signal over path 75, the oscillation initiation circuitry prevents the output from the unit cell 32 being used to assert the clock input signal to the unit cell 12. However, once the oscillation enable signal is asserted, then this will cause the output from the unit cell 32 to assert the clock signal input to the unit cell 12, and begin activation of the ring oscillator 10.

Whilst in FIG. 1 an odd number of unit cells are shown within the ring oscillator 10, due to the way in which the set/reset control circuitry controls the generation of the oscillating output signal it does not matter whether there are an odd number or an even number of unit cells within the ring oscillator.

Figure 2:
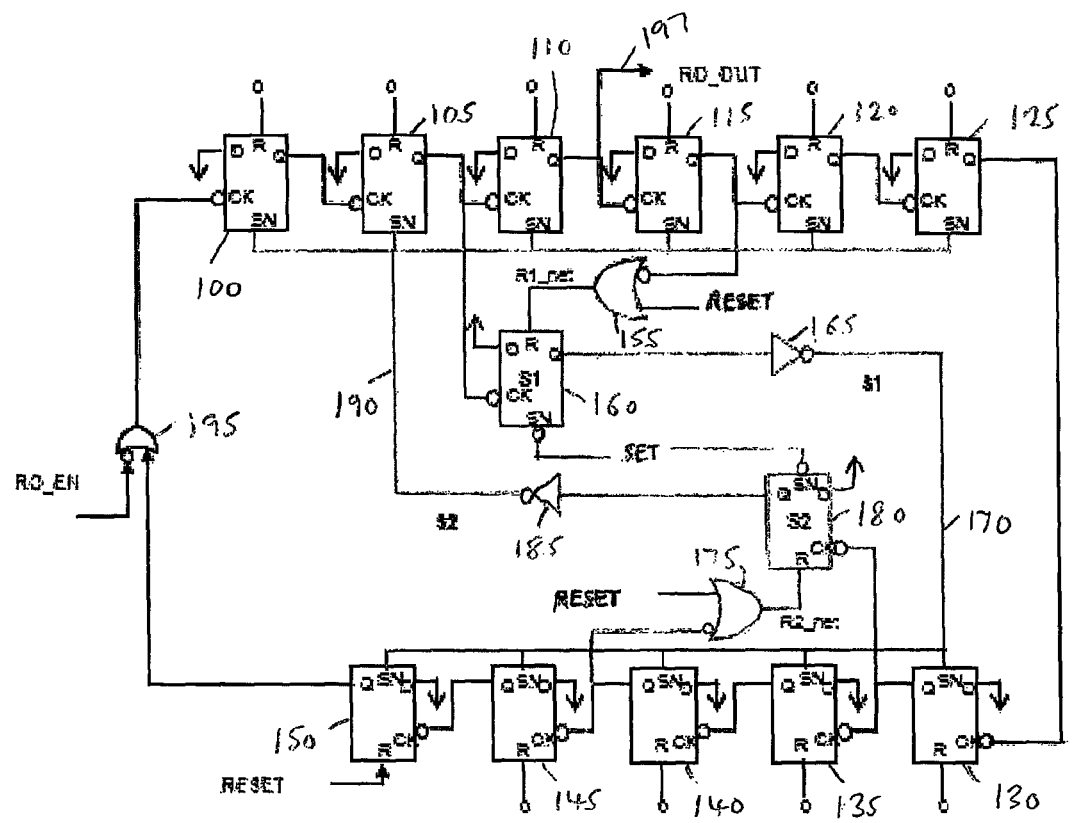
FIG. 2 is a diagram illustrating a first embodiment of the measurement circuitry.

FIG. 2 illustrates a particular embodiment of the measurement circuitry of FIG. 1 where each unit cell consists of a flip-flop. Accordingly, in this example the ring oscillator is formed of the flip-flops 100, 105, 110, 115, 120, 125, 130, 135, 140, 145, 150. The output from each flip-flop is inverted in order to generate the clock input signal for the adjacent flip-flop in the ring oscillator. In this embodiment, the oscillation initiation circuitry takes the forms of the OR gate 195, with the oscillation enable signal being inverted prior to forming one of the inputs to the OR gate 195, and with the output from the flip-flop 150 forming the other input to the OR gate 195.

The set/reset control circuitry 40 of FIG. 1 is constituted by the two flip-flops 160, 180 and the associated logic elements 155, 165, 175, 185.

Each of the flip-flops shown in FIG. 2 has a reset pin R which is active high and a set pin SN which is active low. As shown in FIG. 2, the flip-flops 100, 105, 110, 115, 120, 125, 130, 135, 140, 145 all have their reset pins set to a logic 0 level, thereby disabling the reset function of those flip-flops. However, the flip-flop 150 receives the reset signal at its reset pin, this being the same reset signal that is provided to the set/reset control circuitry and in particular input to the OR gates 155, 175, as shown in FIG. 2.

As also shown in FIG. 2, the set pin of each of the flip-flops 100, 105, 110, 115, 120, 125 is controlled by the signal on line 190, which is the inverted version of the output from the flip-flop 180 (as inverted by the inverter 185). Similarly, the set pin of the flip flips 130, 135, 140, 145 and 150 is controlled by the signal on path 170 which is the inverted version of the output from the flip-flop 160 (as inverted by the inverter 165).

All of the flip-flops 100, 105, 110, 115, 120, 125, 130, 135, 140, 145 and 150 have their input pin D connected to ground, whilst the two flip-flops 160, 180 within the control circuitry have their input pin D connected to the supply voltage VDD. The OR gate 155 is used to produce a reset input to the flip-flop 160 and similarly the OR gate 175 is used to produce a reset input to the flip-flop 180. The clock signal for the flip-flop 160 is an inverted version of the output signal from the flip-flop 105, and similarly the clock input for the flip-flop 180 is an inverted version of the output from the flip-flop 130.

Figure 3A:
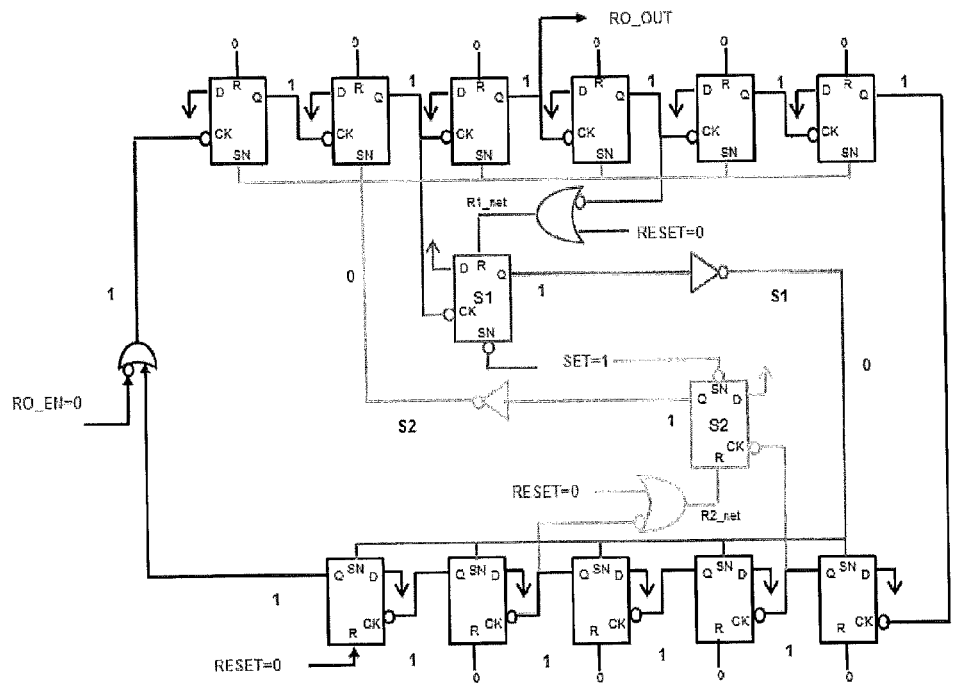
FIGS. 3A to 3F are diagrams illustrating signal values associated with various parts of the measurement circuitry of FIG. 2, at different times during the operation of the measurement circuitry in accordance with one embodiment.
Figure 3B:
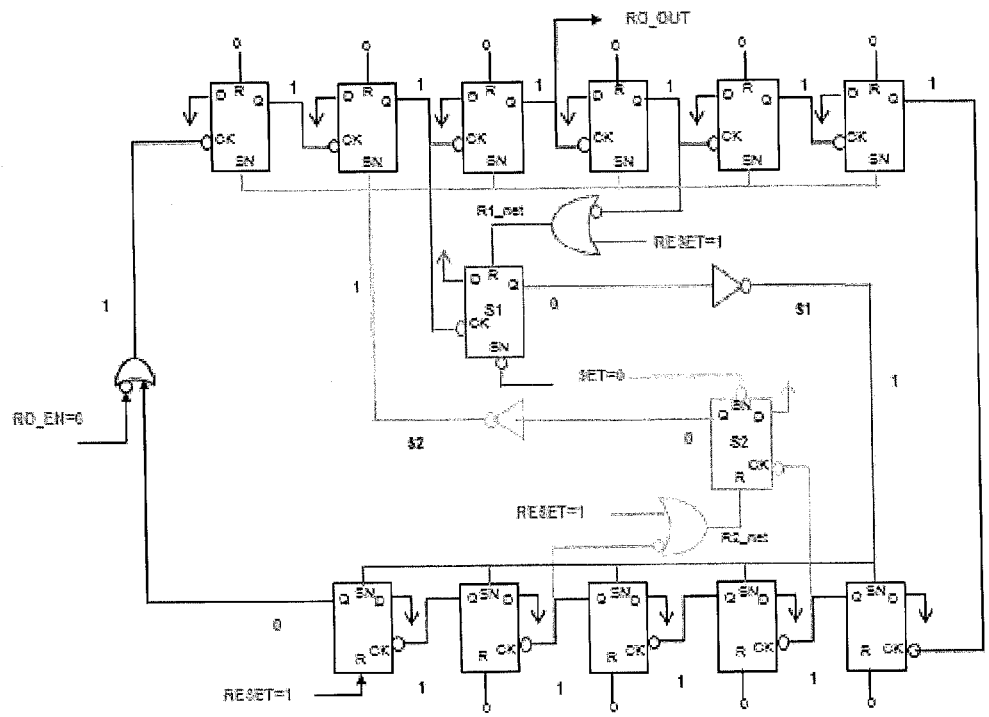
Figure 3C:
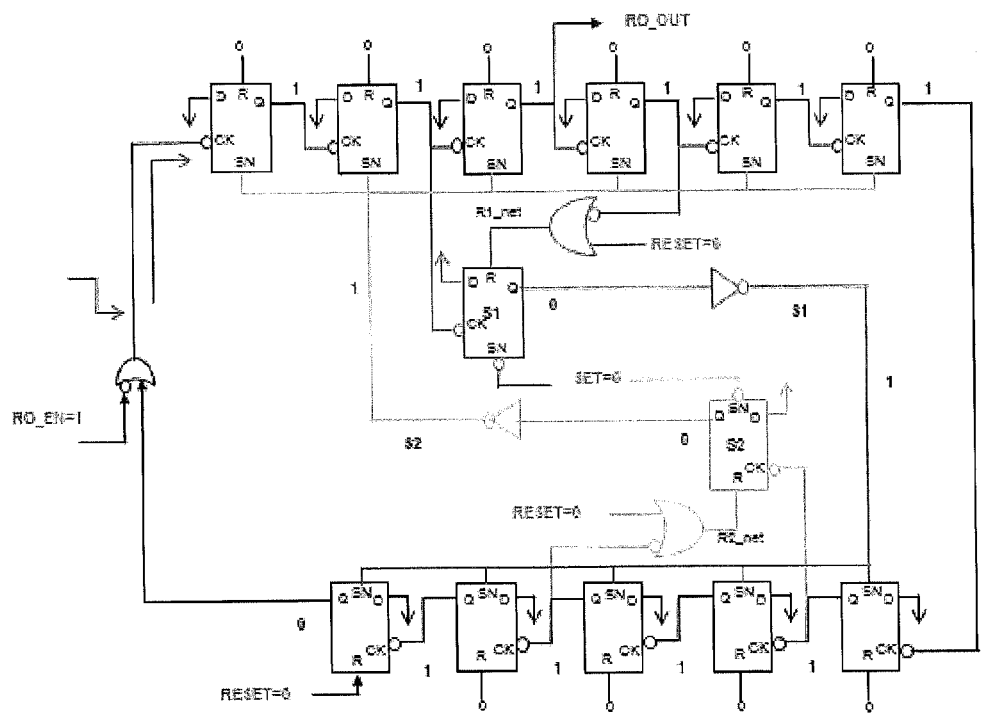

The operation of the circuitry of FIG. 2 will now be described in more detail with reference to FIGS. 3A to 3F and FIG. 4. As shown in FIG. 4, when initialising the circuit, the set input is initially set to a logic 1 level, the reset input is set to a logic 0 level, and the oscillation enable signal RO_EN is set to a logic 0 level. The state of the various signals within the circuitry of FIG. 2 at this point in time is shown in FIG. 3A. Since the set signal is set to a logic one level, this causes the set function of the flip-flops 160, 180 within the control circuitry to be triggered, causing the output signal from both flip-flops to be set to the logic 1 level. This causes logic 0 values to be presented at the set pin inputs of all of the flip-flops within the ring oscillator (via the action of the inverters 165, 185), thereby triggering the set function in all of those flip-flops, and causing the output from all of those flip-flops to be set to a logic 1 value.

Following this step, then as shown in FIG. 4 the set signal is transitioned to a logic 0 value at point 205, and the reset signal is transitioned to the logic 1 value at point 210. The state of the various signals within the circuitry of FIG. 2 at this point in time is then shown in FIG. 3B. In particular, the asserted reset signal is provided to the reset pin of the two flip-flops 160, 180 within the control circuitry via the associated OR gates 155, 175, thereby triggering the reset function of those flip-flops. As a result, the output from those flip-flops transitions to a logic 0 value, causing (via the OR gates 165, 185) the set pins of all of the flip-flops within the ring oscillator to receive a logic 1 value, thereby de-asserting the set functionality of those flip-flops. Hence, for all of the flip-flops in the ring oscillator apart from the final flip-flop 150, neither reset nor set is now asserted. However, the flip-flop 150 receives an asserted reset signal at this point, and accordingly the output from that flip-flop transitions to a logic 0 value. However, at this point in time, the oscillation initiation circuitry 195 prevents that logic 0 value being propagated on to the first flip-flop 100, since the de-asserted oscillation enable signal ensures that a logic 1 value is still output from the oscillation initiation circuitry 195.

At this point, the reset signal can then be de-asserted back to logic 0 value, as indicated by the transition 215 in FIG. 4, and then subsequently the oscillation enable signal can be asserted, as shown by the transition 220 in FIG. 4. The various signals within the circuitry of FIG. 2 at that point in time are shown in FIG. 3C. As will be apparent from a comparison of FIGS. 3B and 3C, the only change at this point in time is that the output from the oscillation initiation circuitry 195 now transitions to a logic 0 value. Since that signal is inverted prior to providing the clock input to the first flip-flop 100, this causes an asserted clock signal to be input to the first flip-flop 100. Given the asserted clock signal, the output of the flip-flop 100 will transition to the value presented at its input pin D, which as discussed earlier is set to ground i.e. a logic low level.

Figure 3D:
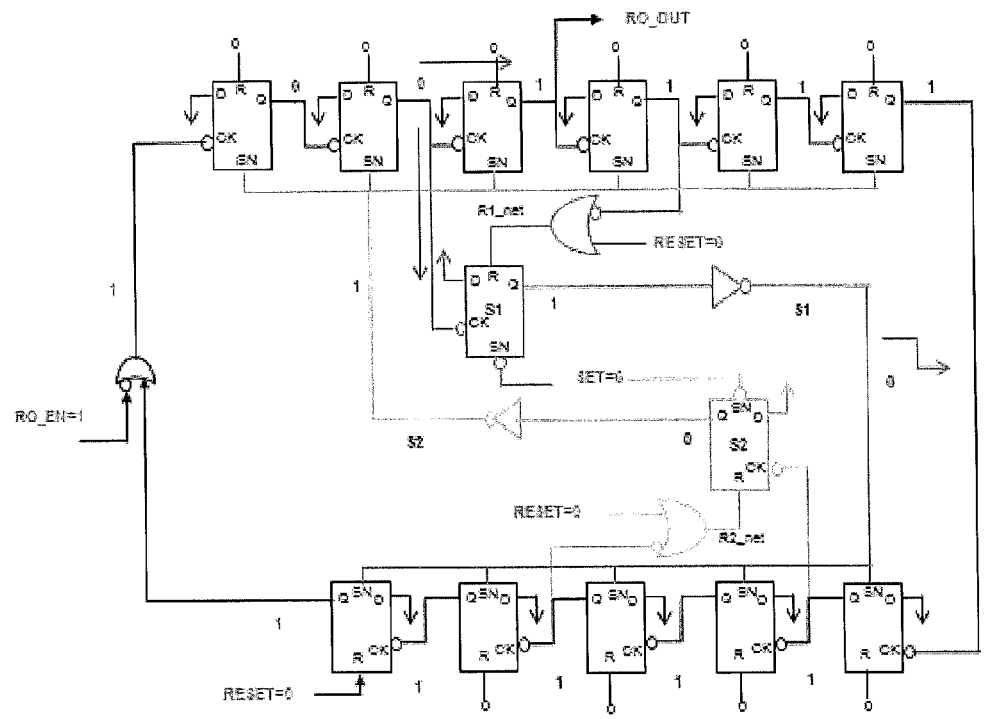
Figure 4:
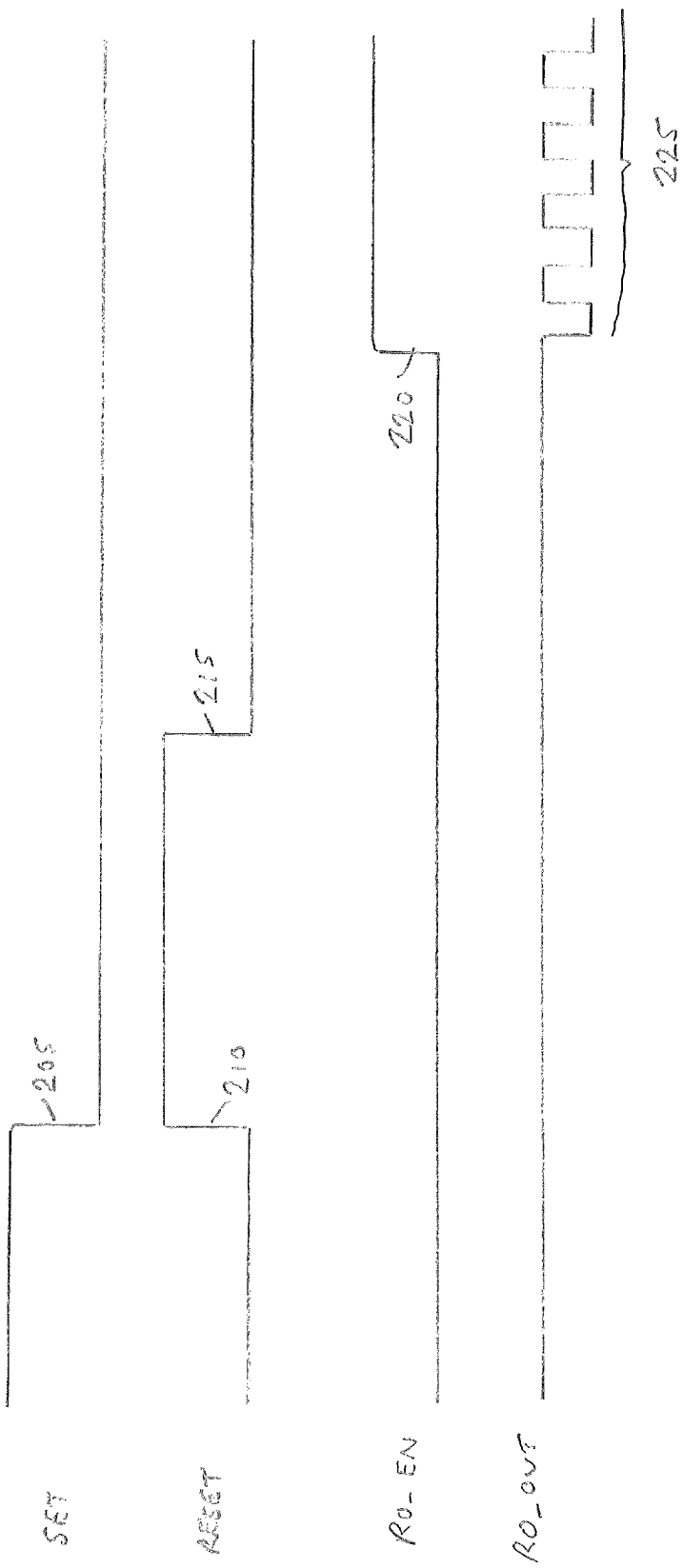
FIG. 4 is a timing diagram identifying the values of certain signals input to, and output from, the measurement circuitry of FIG. 2, in accordance with one embodiment.

Accordingly, as shown in FIG. 3D the output of each flip-flop in turn will transition to a logic 0 value, that causing the subsequent flip-flop to be activated, and thereby cause the subsequent flip-flop's output to be transitioned to a logic 0 value. FIG. 3D shows the point in time where the output from the flip-flop 105 transitioning to a logic 0 value causes an asserted clock input signal to be received at the flip-flop 160. Since the input of that flip-flop is connected to the supply voltage level (i.e. logic one value), this causes the output of the flip-flop 160 to transition back to a logic 1 value, and via the inverter 165 this causes the set function of the flip-flops 130, 135, 140, 145, 150 to be triggered, thereby setting the outputs of those flip-flops to a logic 1 value. During the first iteration round the loop, this step only causes a change in the output of flip-flop 150, since the other flip-flops are currently already outputting a logic 1 value, but it will be appreciated that once a full loop through the ring has occurred, those outputs will have transitioned to a logic 0 value, and accordingly next time round the ring, the above described action will cause those outputs to be set back to the logic 1 value, thereby enabling continued generation of an oscillating output signal from the ring oscillator.

Figure 3E:
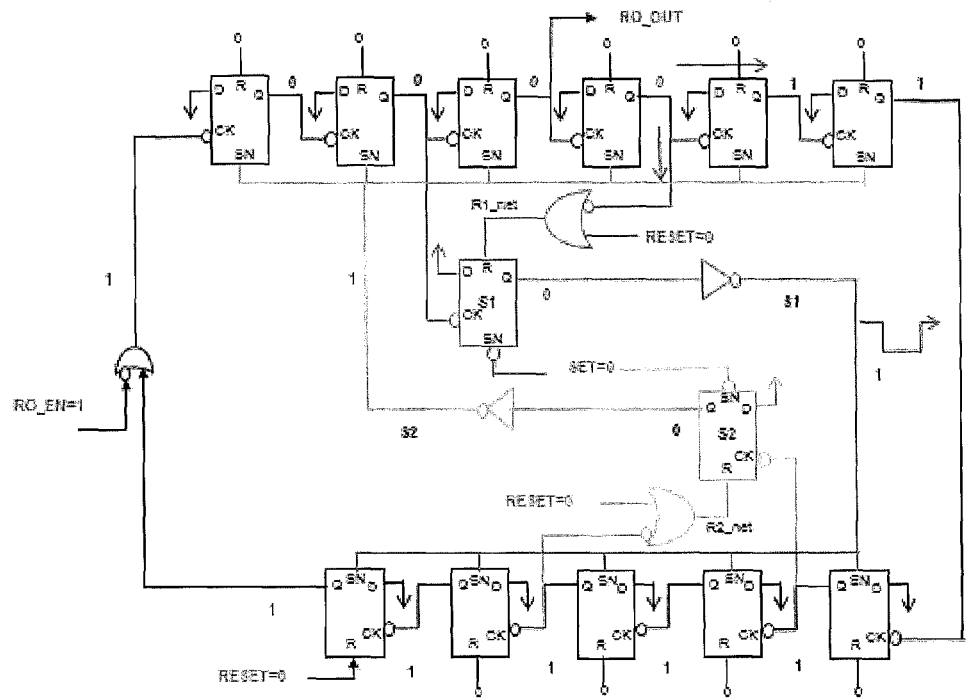

FIG. 3E illustrates the action that takes place once the output from the flip-flop 115 transitions to a logic 0 value. In particular, this causes a logic one value to be input to the reset pin of the flip-flop 160, thereby asserting the reset function, and causing the output of the flip-flop 160 to transition back to the logic 0 value. As a result, it can be seen that the set function of the flip-flops 130, 135, 140, 145, and 150 is then de-asserted at that point. Essentially, it will be appreciated by review of FIGS. 3D and 3E that the functionality described in those figures causes a set pulse to be provided to the flip-flops 130, 135, 140, 145, 150.

Figure 3F:
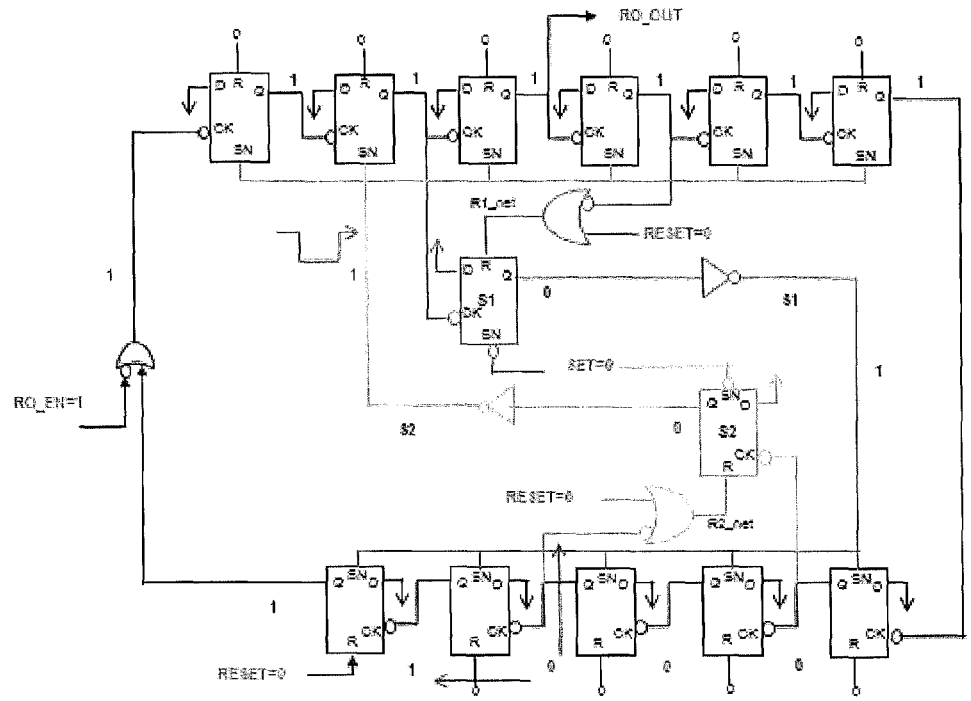

As shown in FIG. 3F, this same functionality is also triggered within the flip-flop 180 based on the transitioning to the logic 0 level of the outputs in the flip-flops 130 and 140, FIG. 3F showing the generation of the set pulse to the flip-flops 100, 105, 110, 115, 120, 125.

As will be appreciated from FIG. 3F, as the logic 0 output is propagated through the remaining flip-flops, this will cause the output from the final flip-flop 150 to be pulled to the logic 0 value, thereby reasserting the clock input to the first flip-flop 100, and beginning another iteration through the ring oscillator. Accordingly, it will be appreciated that during each iteration through the ring oscillator, the output of every flip-flop is transitioned from the logic 1 level to the logic 0 level, with the action of the control circuitry causing the outputs to be set back to the logic 1 value part way through each iteration through the ring oscillator. Accordingly, it will be seen that the output signal RO_OUT over path 197 takes the oscillating form 225 shown in FIG. 4. Assuming that the circuit in FIG. 2 consists of N flip-flops then the period of the oscillation ($T_{OSC}$) is given by the following equation:

$$T_{OSC} = ((T_{clock\text{-}Q\text{-}falling}) + (T_{inv\text{-}rising})) \times N + T_{or\text{-}falling}$$

where $T_{clock\text{-}Q\text{-}falling}$=Falling clock-to-Q delay for a flip-flop, $T_{inv\text{-}rising}$=Rise delay for an inverter, and $T_{or\text{-}falling}$=Fall delay for an OR gate.

Accordingly, it can be seen that such a circuit can be used to calculate the falling clock-to-Q delay of a flip-flop. The circuit of FIG. 2 has been found to be a particularly compact and efficient mechanism for determining the falling clock-to-Q delay, using standard digital components such as may be found in a standard cell library.

Figure 5:
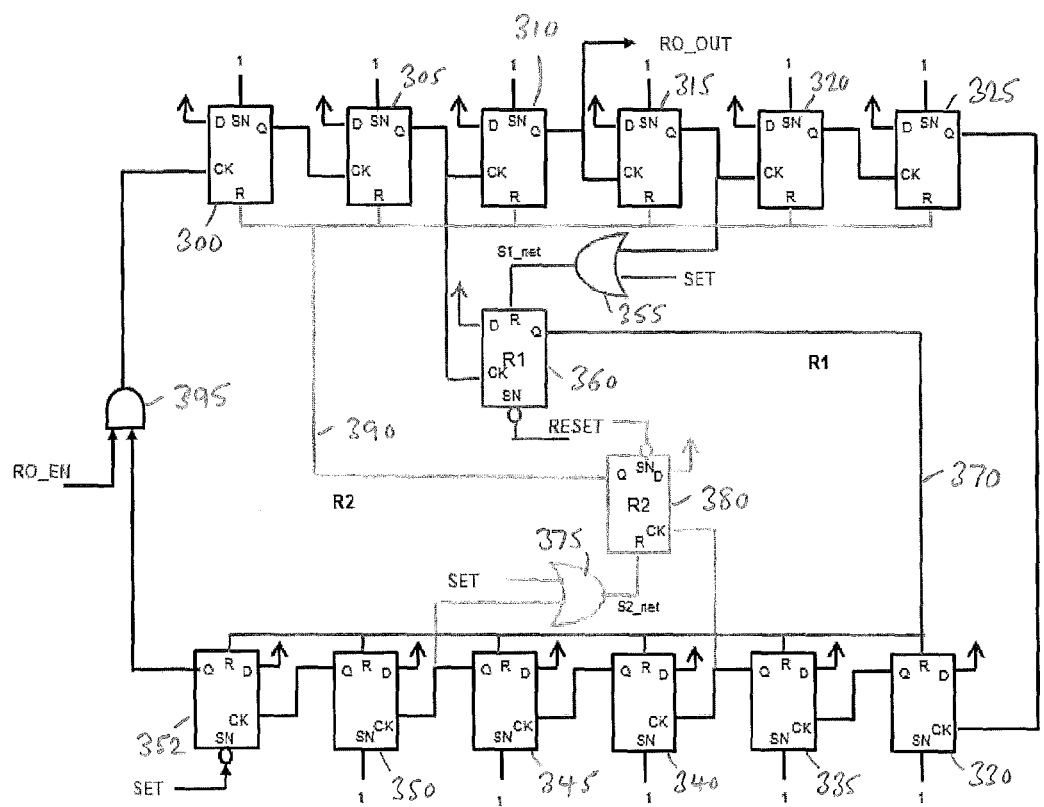
FIG. 5 is a diagram illustrating a second embodiment of the measurement circuitry.

It is also possible to produce a modified version of the measurement circuitry that enables the rising clock-to-Q delay to be calculated. Such a circuit is shown in FIG. 5. In this example, the ring oscillator contains the flip-flops 300, 305 310, 315, 320, 325, 330, 335, 340, 345, 350 and 352. The control circuitry is formed of the two flip-flops 360, 380 along with the associated OR gates 355, 375. The control circuitry does not require the inverters 165, 185 that were used in the example of FIG. 2. In this example, the oscillation initiation circuitry 70 takes the form of the AND gate 395. As can be seen, the functionality of the set and reset signals is essentially reversed with the respect to that described in FIG. 2, with the reset signal being used to control the set function of the flip-flops 360, 380 and the set signal being used to control the reset function of those flip-flops. Each of the flip-flops in the ring oscillator has its reset function controlled by the control circuitry, and all but the final flip-flop 352 have their set function disabled by receiving a logic 1 value at the set pin SN. However, for the final flip-flop 352, the set pin is controlled by the set signal, the set signal being inverted prior to provision to the set pin due to the set pin being an active low set pin.

When adopting the measurement circuitry of FIG. 5, the timing diagram is essentially as shown in FIG. 4, but with the set and reset signals reversed. Hence, accordingly the reset signal is originally asserted at a logic 1 level, and then when the reset signal transitions to a logic 0 value, the set signal is asserted at a logic 1 value. Sometime later the set signal is subsequently de-asserted to the logic 0 value, and then the oscillation enable signal is asserted at the point 220, triggering generation of the oscillating output signal. It will be appreciated that the operation of the circuitry of FIG. 5 is similar to that described earlier for the circuitry of FIG. 2. However, the output signals from each of the flip-flops in the ring oscillator are originally primed to the logic 0 value, and by connecting the input pins D to the supply voltage level, then during each iteration to the ring oscillator the output signal transitions from a logic 0 value to a logic 1 value. Accordingly, it can be seen that the oscillating output signal RO_OUT can be used to determine the rising clock-to-Q delay of a flip-flop. In particular, again assuming that there are N flip-flops within the ring oscillator, the period of the oscillation $T_{OSC}$ can be calculated by the following equation:

$$T_{OSC} = (T_{clock-Q-rising}) \times N + T_{and-rising}$$

where $T_{clock-Q-rising}$=Rising clock-to-Q delay for a flip-flop, and $T_{and-rising}$=Rise delay for an AND gate.

It will be noted that in FIG. 5 there are an even number of flip-flops, whilst in FIG. 2 there are an odd number of flip-flops. In fact, it does not matter in either embodiment whether there are an even number or an odd number of flip-flops, and accordingly the circuitry of FIG. 2 can be modified to include an even number of flip-flops, and similarly the circuitry of FIG. 5 can be modified to include an odd number of flip-flops.

Figures 6A, 6B:
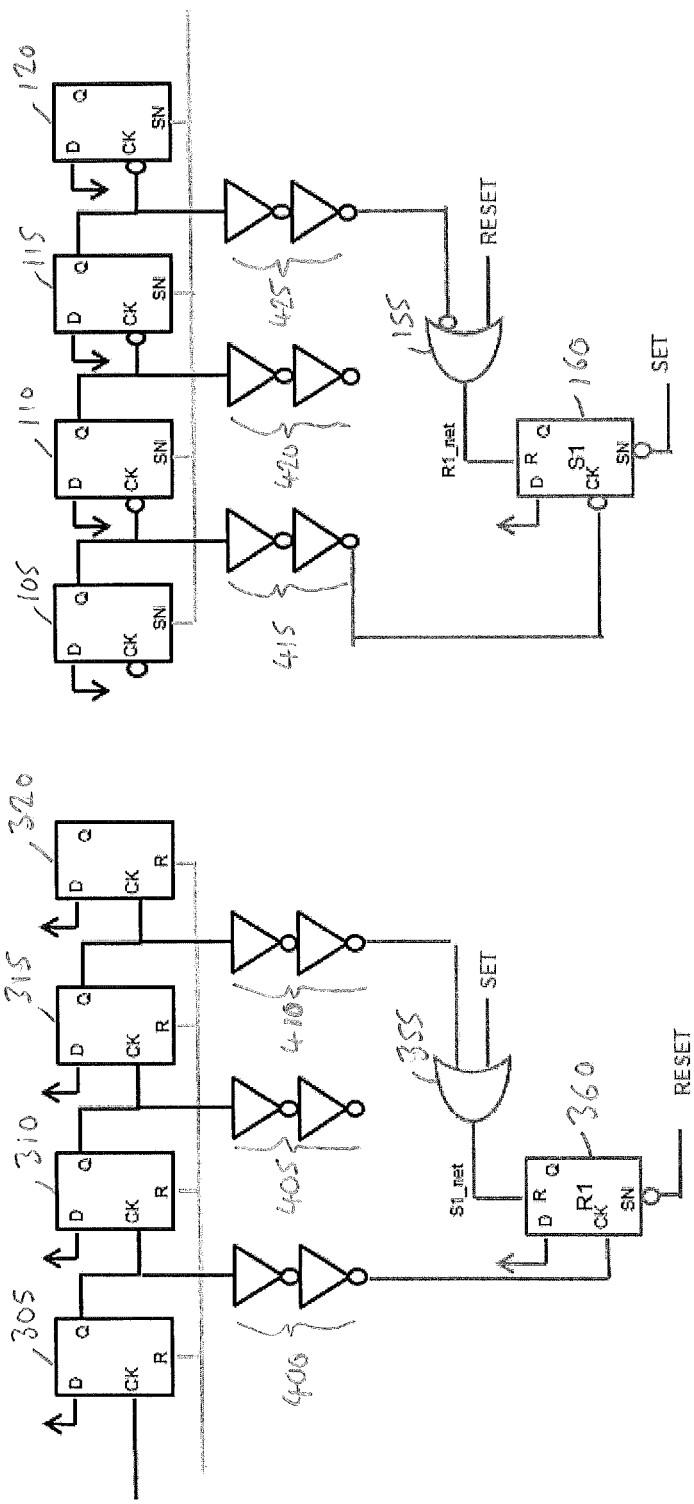
FIGS. 6A and 6B illustrate loading circuits that can be incorporated within the measurement circuitry of the described embodiments.

In order to have similar clock-to-Q delay for each flip-flop in the ring oscillator structure, it is preferable to ensure that the outputs of the flip-flops have uniform loading. This can be achieved by loading the outputs of each flip-flop with a loading circuit formed for example from inverters or buffers. FIGS. 6A and 6B show example loading structures constructed using inverters, FIG. 6A showing the circuitry associated with certain of the flip-flops of the measurement circuitry of FIG. 5 and FIG. 6B showing the loading structures associated with certain of the flip-flops of the measurement circuitry of FIG. 2. As shown in FIG. 6A, each of the loading structures 400, 405, 410 is formed by a pair of inverters. For those output signals that are also used by the control circuitry, then the outputs of the relevant loading structures 400, 410 can be provided directly to the control circuitry. For any flip-flops whose output signal is not used by the control circuitry, and is merely used to generate the clock input for the next flip-flop, then the output of the loading structure can be left floating, as shown for the example of the loading structure 405 in FIG. 6A. Whilst only the loading structures associated with the flip-flops 305, 310, 315 are shown, in one embodiment all of the flip-flops within the ring oscillator will have such loading structures connected thereto.

FIG. 6B shows the equivalent loading structures 415, 420, 425 used in association with the flip-flops 105, 110, 115 of the measurement circuitry of FIG. 2.

Figure 7:
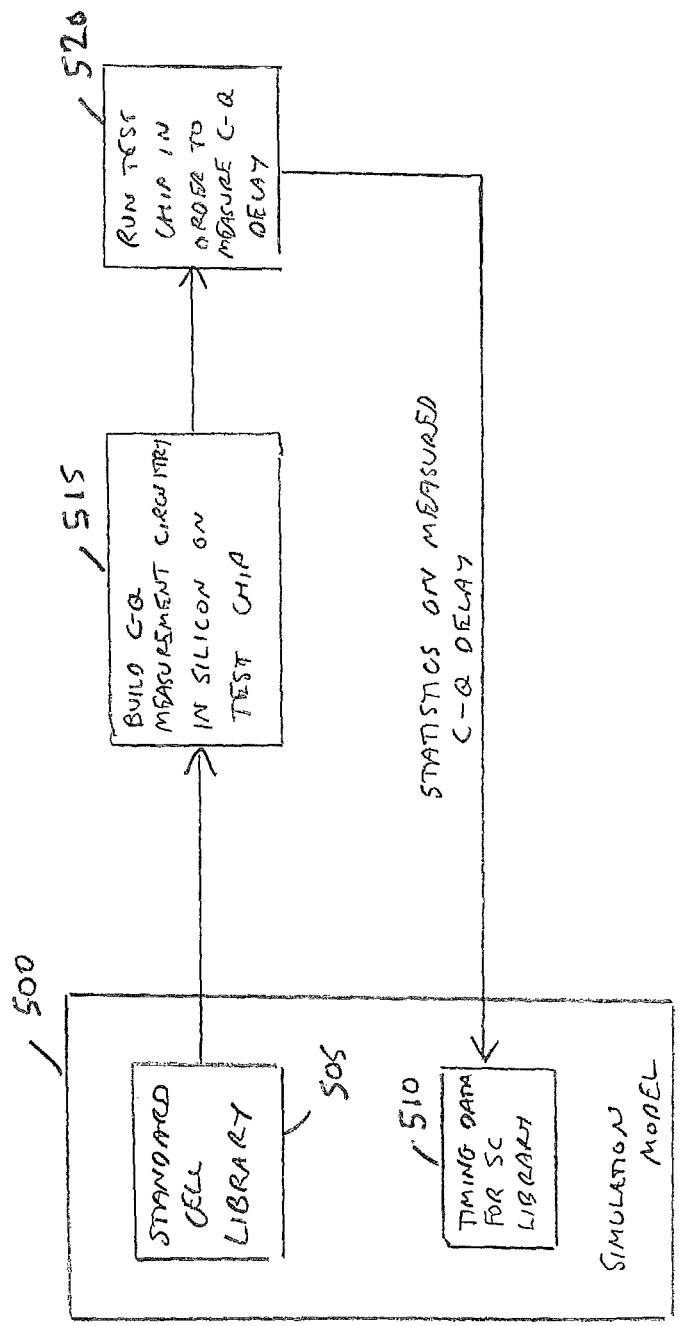
FIG. 7 illustrates one use case for the measurement circuits of the described embodiments.

FIG. 7 illustrates an example use case for the measurement circuits of the described embodiments. In this embodiment, a standard cell library 505 consisting of a plurality of standard cells is provided within a simulation model 500. At step 515, a C-Q measurement circuit is built in silicon on a test chip using components from the standard cell library. In particular, when using the implementations shown in FIG. 2 or 5, it will be appreciated that the measurement circuitry can be built directly from standard cell components. In this embodiment, it is desired to test the C-Q delay of a standard cell component defining the flip-flop.

Accordingly, once the test chip has been built at step 515, the test chip can be run at step 520 in order to measure the C-Q delay using the measurement circuitry, and that C-Q delay can be returned to the simulation model for storing within timing data 510 for the standard cell library. This timing data is specific to the process technology used for the test chip (for example 45 nm, 22 nm, etc.).

Whilst in one embodiment the C-Q delay can be returned directly to include within the timing data 510, in an alternative embodiment control circuitry may be provided to determine other statistics related to the measured C-Q delay, and return those statistics for incorporation within the timing data 510. For example, multiple instances of the measurement circuitry could be included in the test chip, with the outputs from those multiple instances being used to determine one or more operating characteristics of the test chip.

As an alternative to employing the measurement circuits within a test chip, such as shown in FIG. 7, the measurement circuits can also be used to provide in-situ, run-time measurements within a data processing system, in which case the measurement circuits can be viewed as a type of sensor.

Figure 8:
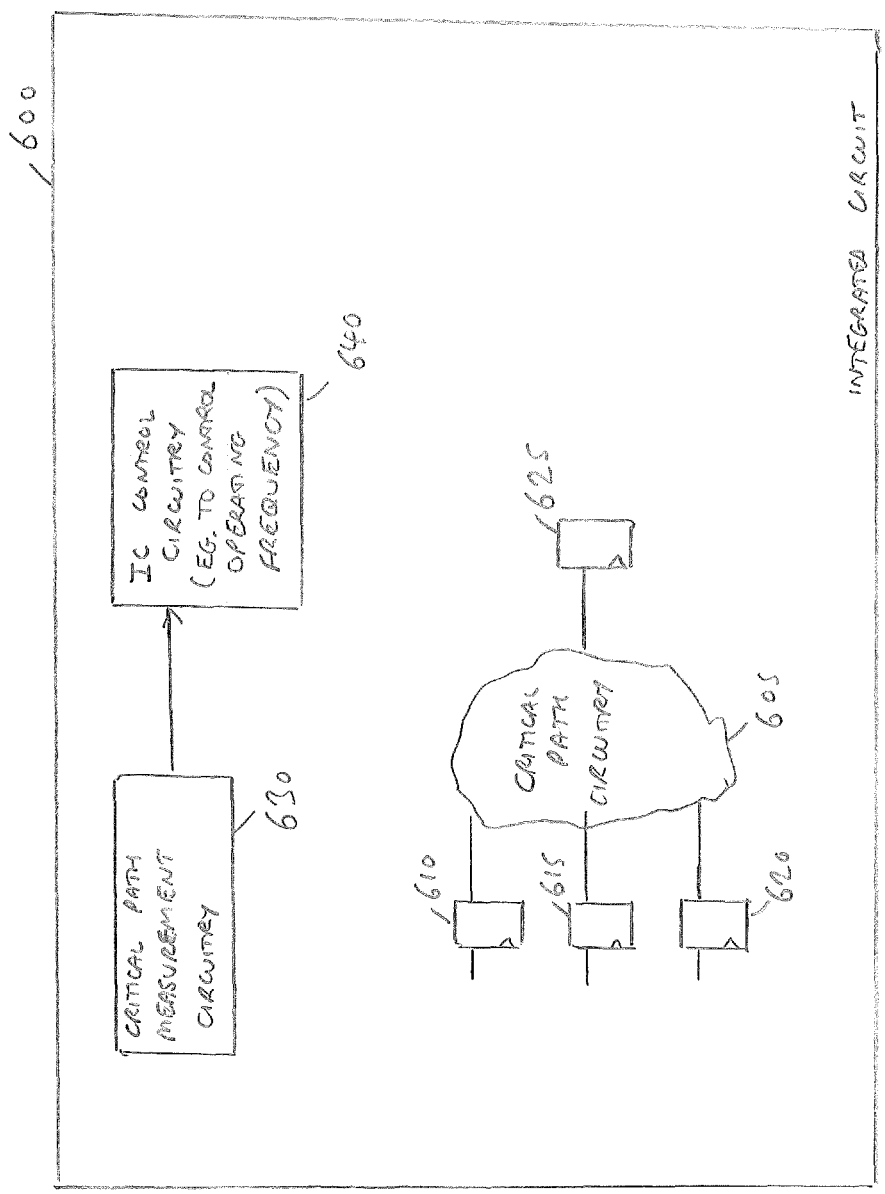
FIG. 8 illustrates a different use case for the measurement circuits of the described embodiments.

One such arrangement for using the measurement circuitry in a run-time way is shown in FIG. 8, where the measurement circuitry 630 is included within an integrated circuit 600. The integrated circuit will typically include a number of different processing circuits for performing data processing operations. Typically those processing operations are pipelined, and at the end of each pipeline stage data values are stored in flip-flops, prior to then being propagated on to the next pipeline stage during the next clock cycle. It is often the case that the combinatorial logic circuits included in at least one of the pipeline stages represent a critical path within the system, the time taken to process the signals with those combinatorial logic circuits and then correctly sample the output in the destination flip-flop for that processing stage effectively placing an upper limit on the frequency at which the integrated circuit can be operated.

Such a critical path is shown in FIG. 8 by the critical path circuitry 605. Typically, the combinatorial logic with the critical path circuitry 605 will take a number of inputs from the flip-flops 610, 615, 620 (there could be more or less than 3 inputs), and produces an output value for storing in the destination flip-flop 625.

However, in practice process, voltage and temperature variations (typically referred to as PVT variations) vary the speed at which the critical path circuitry operates, and accordingly will affect the maximum frequency at which the integrated circuit can be operated. By using the measurement circuitry of one embodiment, it is possible to obtain a measure of the time taken by the critical path circuits in situ, and produce an output to integrated circuit control circuitry 640, which can then use that information to control operating parameters of the integrated circuit such as the operating frequency at which the integrated circuit is run. Optionally other operating parameters could also be changed in dependence on this information, such as the operating voltage. By such an approach, it is possible to take account of various effects within the integrated circuit, such as on-chip variation (in embodiments where the measurement circuitry is placed in multiple locations within the integrated circuit), voltage drop and temperature sensitivity.

As shown in FIG. 8, the measurement circuitry 630 takes the form of critical path measurement circuitry. This takes the general form as discussed earlier in FIG. 1, but in this instance each unit cell may have the form shown in FIG. 9. In particular, there is a still a flip-flop 655 at the input to the unit cell whose clock input signal is derived from the output of a preceding unit cell. The output 666 from the flip-flop 655 is passed through the critical path circuitry 660, resulting in generation of an output signal 668 which is then used to generate the clock input to the next unit cell in the ring oscillator. As is apparent from FIG. 8, typically critical path circuitry will have multiple inputs and produce a single output. As shown in the example shown in FIG. 9, the copy of the critical path circuitry 660 included within the unit cell has all but one of the inputs tied to predetermined values. Accordingly, the inputs 662 and 664 are tied to a predetermined value. As a result, it will be appreciated that the combinatorial circuitry within the critical path circuitry 660 will either end up producing an output signal 668 whose value matches the value of the signal on path 666, or will produce an inverted version of the signal on path 666. This can be used to determine whether an inversion of the output signal 668 is required prior to providing the input to the clock pin of the next flip-flop. For example, when arranging the measurement circuitry generally as shown in FIG. 2, but with each of the flip-flops replaced by the unit cell 650 shown in FIG. 9, if the critical path circuitry 660 does not invert the output from the flip-flop 655, then the inversion of the output signal prior to input to the clock pin of the next unit cell's flip-flop is still required. However, if the critical path circuitry itself performs an inversion, then there is no need for the separate inverter at the clock pin input. Similarly, with regards to the FIG. 5 approach, if the critical path circuitry does not perform an inversion, then the output over path 668 can be provided directly to the clock pin of the next unit cell's flip-flop. However, if the critical path circuitry does produce an inversion, then a separate inversion will again be required prior to inputting the output signal 668 to the clock input of the next unit cell's flip-flop.

Figure 9:
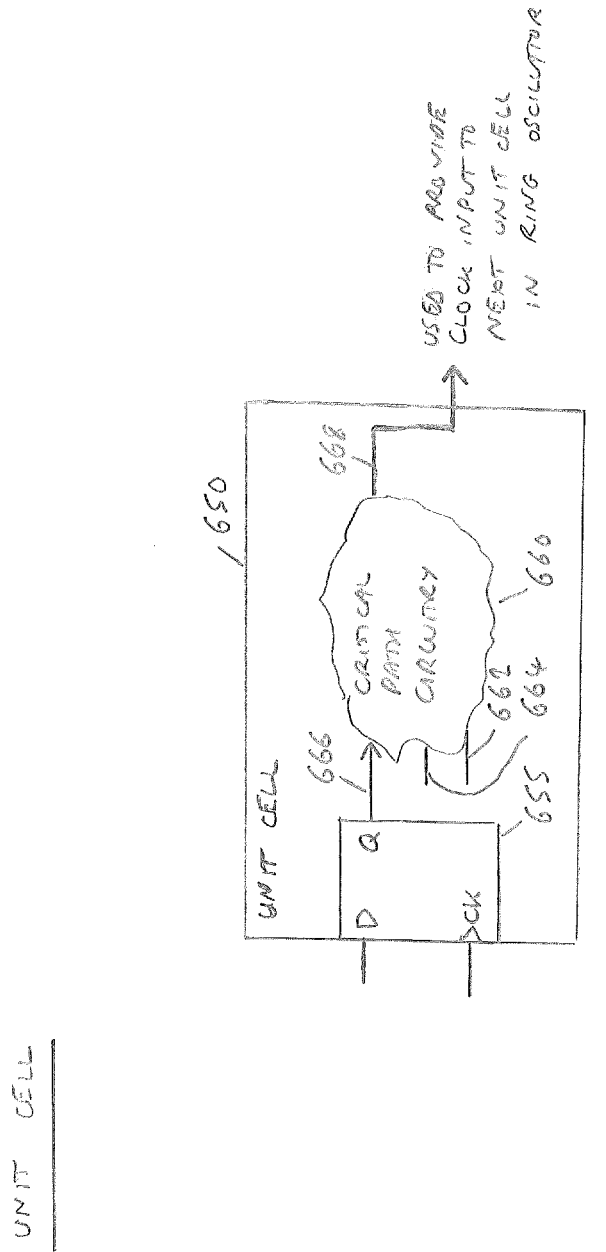
FIG. 9 schematically illustrates the elements provided within each unit cell of the measurement circuitry illustrated in FIG. 8 in accordance with one embodiment.
Figure 10:
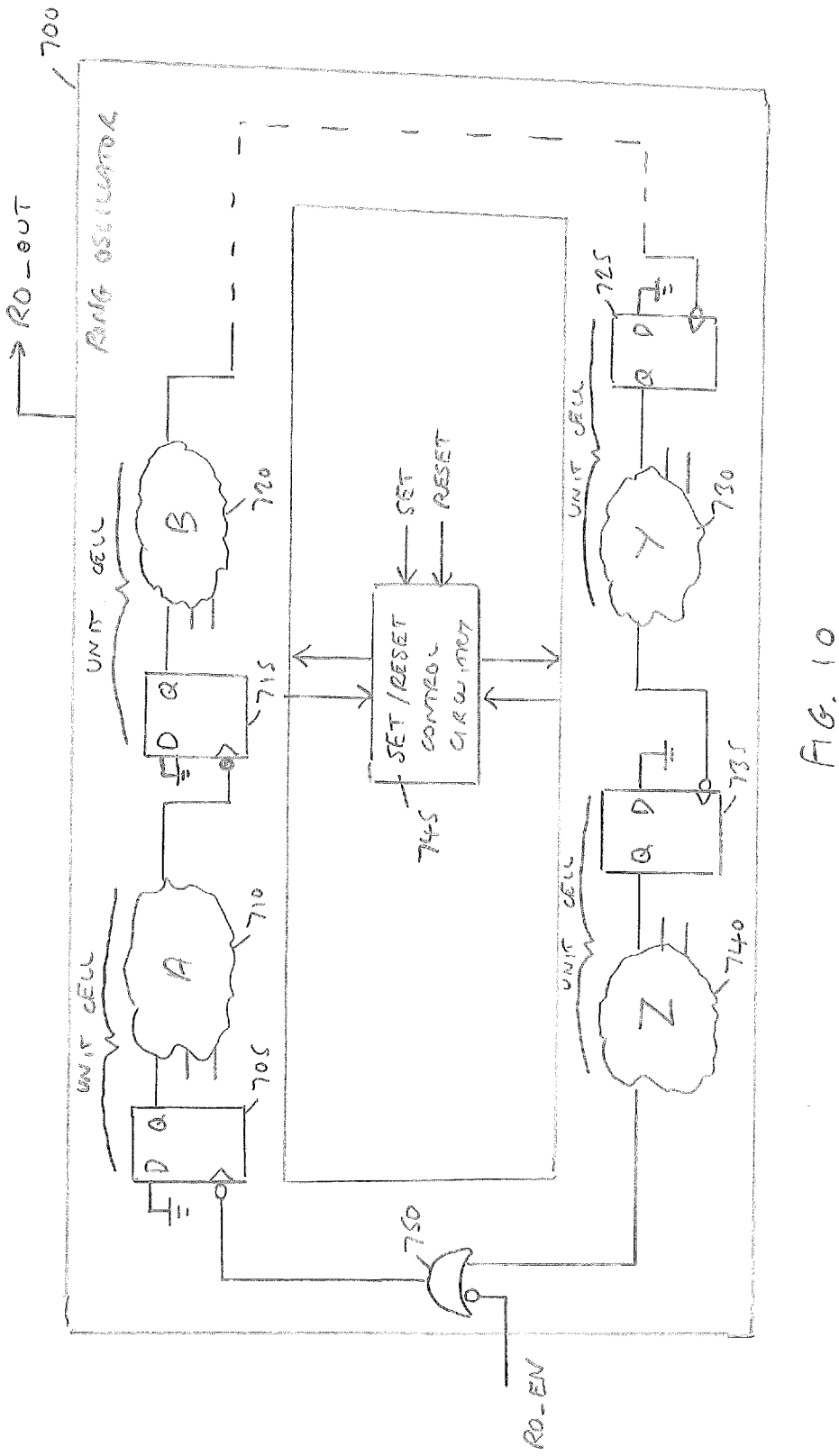
FIG. 10 is a diagram schematically illustrating the measurement circuitry of FIG. 8 in accordance with one embodiment.

FIG. 10 schematically illustrates the ring oscillator of one embodiment when using the unit cell arrangement of FIG. 9. As shown, each of the unit cells includes a flip-flop and associated critical path circuitry. In this example, it is assumed that the general arrangement discussed earlier in FIG. 2 is used, and accordingly the inputs of each of the flip-flops are tied to ground, and the oscillation initiation circuitry takes the form of the OR gate 750. The first unit cell consists of the flip-flop 705 and associated critical path circuitry 710, the next unit cell consists of the flip-flop 715 and associated critical path circuitry 720 and the final two unit cells within the ring oscillator consist of the flip-flop 725 and critical path circuitry 730, and the flip-flop 735 and critical path circuitry 740, respectively. The set/reset control circuitry 745 controls the set function of each of the flip-flops 705, 715, 725, 735 using the mechanism described earlier with reference to FIG. 2. In this example, it is assumed that each of the critical path circuits is non-inverting and accordingly the inversion of the output signal prior to input to the clock pin of each flip-flop is still required. However, as discussed earlier, each of the critical path circuits could be inverting, and in that event the additional inversion prior to input to the clock pin would not be required. Each of the critical path circuits 710, 720, 730, 740 could be a copy of the same critical path circuit within the integrated circuit. By such an arrangement, it is possible to account the for on-chip variation within the integrated circuit in relation to that critical path circuit. Alternatively, not all of the critical path circuits 710, 720, 730, 740 will relate to the same real critical path circuitry in the integrated circuit. For example, if there are multiple different critical paths within the integrated circuit, individual ones of those critical paths could be represented by different ones of the critical path sections 710, 720, 730, 740 in FIG. 10. By such an approach it is possible to account for a weighted average of the expected critical paths when producing the output oscillation signal.

The frequency of the oscillating output signal RO_OUT multiplied by the number of unit cells within the ring oscillator 700 can be used to provide an indication of the approximate maximum frequency that the integrated circuit could be operated at under the prevailing PVT conditions. Hence, this information can be provided to the IC control circuitry 640 in FIG. 8, in order to control the operating frequency of the integrated circuit. This means that if the conditions under which the integrated circuit is operating change such that for example the circuits are able to run slightly more quickly, this can be detected by the critical path measurement circuitry 630, and the operating frequency increased accordingly. Conversely, if the conditions change such that the circuits operate more slowly, this can be detected from the output of the measurement circuitry 630 and used to reduce the operating frequency.

It will be appreciated that in principle other operating parameters of the integrated circuit could also be varied in dependence on the output from the measurement circuitry. For example, the control circuitry may be able to vary the voltage at which the components in the integrated circuit containing the critical path blocks operate.

Figure 11A:
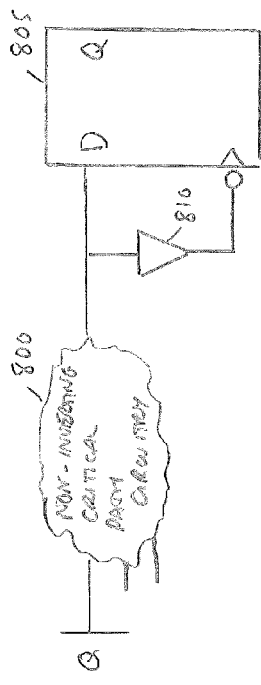
FIGS. 11A and 11B illustrate alternative connections that can be made in accordance with one embodiment in order to set the input pin of each flip-flop to the required voltage level during operation of the ring oscillator to produce an oscillating output signal.
Figure 11B:
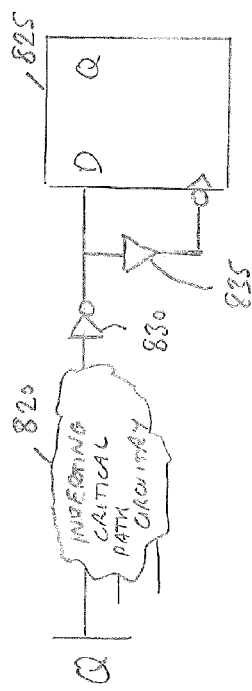

In the example of FIG. 10, it is assumed that the input pins D of each of the flip-flops 705, 715, 725, 735 are tied to a predetermined voltage, in this example ground. However, if it is desired to account for the flip-flop set-up time as well in the oscillation period of the ring oscillator, then alternative connection approaches can be taken as shown in FIGS. 11A and 11B. In particular, if the critical path circuitry 800 is non-inverting, then its output can be used directly to set the D input of the next flip-flop 805. The buffer 810 is used to delay propagation of the clock signal to the clock input so that the D input has time to stabilise before the clock signal is asserted. FIG. 11B shows an alternative approach where the critical path circuitry 820 is an inverting critical path circuit. In that instance, an additional inverter 830 can be added to ensure that the D input pin is set to the appropriate value. Again, the buffer 835 is added to delay the clock input transition so that the value at the input D of the flip-flop 825 has time to settle to the correct value prior to the clock input being asserted.

Figure 12A:
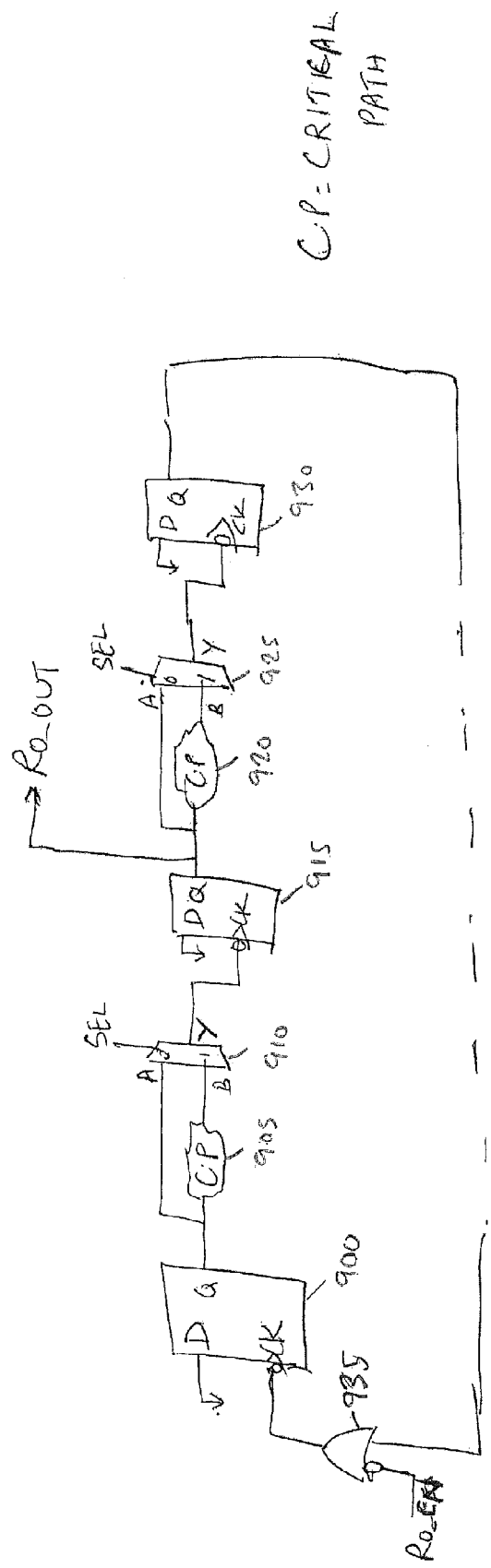
FIG. 12A is a diagram schematically illustrating the measurement circuitry of FIG. 8 in accordance with an alternative embodiment.

FIG. 12A is a diagram schematically illustrating the measurement circuitry of FIG. 8 in accordance with an alternative embodiment to that shown in FIG. 10. As with FIG. 10, each unit cell includes a flip-flop and associated critical path circuitry. A portion of the ring oscillator is shown including the flip-flops 900, 915, 930 and intervening critical path circuitry 905, 920. As with FIG. 10, the D input of each flip-flop is tied to ground, and the oscillation initiation circuitry takes the form of an OR gate 935.

However, in this embodiment each unit cell also includes a multiplexer, two such multiplexers 910, 925 being shown in FIG. 12A. In accordance with this embodiment, the output oscillating signal RO_OUT may be measured when the selected input to each of the multiplexers is set to 0, hence bypassing the critical path circuitry. The resulting measured oscillating period will be referred to herein as $TP_{FF}$, and captures timing information relating to the flip-flops themselves.

Separately, the ring oscillator may be re-run, but this time with the select signal to each multiplexer set to 1, thereby producing an oscillating output signal having an oscillating period which will be referred to herein as $TP_{CP}$, and takes into account the delay introduced by the critical paths.

On the assumption that the delay between input A and output Y of the multiplexer is the same as the delay between input B and output Y of the multiplexer, then the value $TP_{CP}-TP_{FF}$ directly provides the critical path delay, since any common path delays are cancelled out.

Figure 12B:
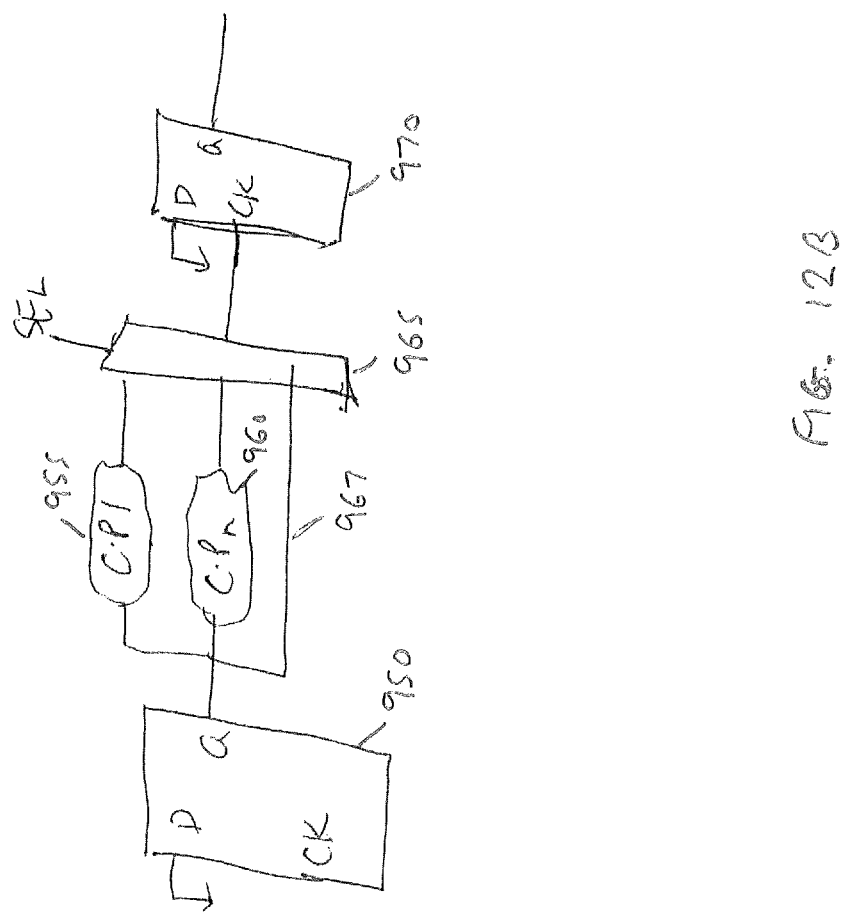
FIG. 12B illustrates a modification that can be made to the arrangement of FIG. 12A in accordance with one embodiment.

The approach shown in FIG. 12A can be extended as shown in FIG. 12B, which shows two flip-flops 950, 970, and multiple intervening critical path circuits 955, 960. Such an approach enables multiple critical paths to be tested, and for the results obtained in this way from a silicon test chip to be compared with simulation results. Hence, in this example each unit cell includes multiple different critical path circuit blocks 955, 960, each of which can be independently selected by the multiplexer 965. A bypass path 967 is also selectable, as per the example of FIG. 12A.

From the above described embodiments, it will be seen that such embodiments provide a compact and efficient measurement circuit for generating an output signal that can be used to derive a variety of different pieces of timing information. The measurement circuitry is able to produce accurate timing information with low power consumption and low leakage current. In one use case, the measurement circuitry can be used at design time of sequential storage elements such as flip-flops to categorize certain timing information of those flip-flops, such as the falling clock-to-Q delay or the rising clock-to-Q delay. In an alternative use case, the measurement circuitry can be implemented in situ in an active data processing system such as an integrated circuit, producing in real time timing information which can be used to control the operation of the integrated circuit.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. Measurement circuitry for generating an oscillating output signal used to derive timing information, the measurement circuitry comprising:
a ring oscillator comprising a plurality of unit cells, each unit cell comprising at least a storage element whose output signal is used to determine a clock input signal for an adjacent unit cell of said plurality of unit cells within the ring oscillator;
control circuitry capable of performing a control operation to control one of a set function and a reset function of the storage element in each of said plurality of unit cells in dependence on set and reset signals input to the control circuitry; and
oscillation initiation circuitry capable of changing a state of the clock input signal received by the storage element of a first one of said plurality of unit cells upon receipt of an asserted oscillation enable signal, in order to initiate generation of the oscillating output signal;
the control circuitry being capable of performing the control operation after the generation of the oscillating output signal is initiated in order to control a value of the output signal of the storage element in each unit cell so as to cause the oscillating output signal to be maintained.

2. Measurement circuitry as claimed in claim 1, wherein the control circuitry is further capable of performing the control operation prior to the generation of the oscillating output signal being initiated in order to control an initial value of the output signal of the storage element in each unit cell so as to enable oscillation in the oscillating output signal to be begin once the oscillation initiation circuitry asserts the clock input signal received by the storage element of said first one of said plurality of unit cells.

3. Measurement circuitry as claimed in claim 1, wherein:
said ring oscillator comprises multiple portions; and
the control circuitry is capable of generating separate control signals for each of said multiple portions, so as to enable said one of the set function and the reset function to be controlled independently for the storage elements of the unit cells in different portions of the ring oscillator.

4. Measurement circuitry as claimed in claim 3, wherein, after the generation of the oscillating output signal is initiated, the control circuitry performs said one of the set function and the reset function independently for the storage elements of the unit cells in different portions of the ring oscillator.

5. Measurement circuitry as claimed in claim 3, wherein the control circuitry comprises a storage element for each of said multiple portions, whose set and reset functions are controlled by the set and reset signals input to the control circuitry, and whose output signal is used to control said one of the set function and the reset function of the storage elements of the unit cells in a corresponding portion of the ring oscillator.

6. Measurement circuitry as claimed in claim 5, wherein each storage element in the control circuitry is arranged to further receive control inputs derived from output signals associated with storage elements of predetermined unit cells in the associated portion of the ring oscillator.

7. Measurement circuitry as claimed in claim 1, wherein whichever one of the set function and the reset function of the storage element in each of said plurality of unit cells is controlled by the control circuitry, the storage element in multiple but not all of said plurality of unit cells is arranged to have the other of the set function and the reset function disabled.

8. Measurement circuitry as claimed in claim 7, wherein the storage element in one of said plurality of unit cells is arranged to have the other of the set function and the reset function controlled by the appropriate one of the set signal and the reset signal input to the control circuitry.

9. Measurement circuitry as claimed in claim 8, wherein the oscillation initiation circuitry is configured to gate the output signal from the storage element in said one of said plurality of unit cells such that that output signal is used to determine the clock input signal received by the storage element of said first one of said plurality of unit cells upon receipt of said asserted oscillation enable signal.

10. Measurement circuitry as claimed in claim 1, wherein the storage unit in each unit cell has its data input set to a predetermined value during generation of the oscillating output signal.

11. Measurement circuitry as claimed in claim 1, wherein each unit cell includes loading circuitry to apply a load on the output signal from the storage element.

12. Measurement circuitry as claimed in claim 1, wherein the storage element in each unit cell is a flip-flop.

13. Measurement circuitry as claimed in claim 12, wherein the timing information derived from the oscillating output signal is a clock-to-Q delay of the flip-flop.

14. Measurement circuitry as claimed in claim 13, wherein the storage unit in each unit cell has its data input set to a logic low value during generation of the oscillating output signal, and the timing information derived from the oscillating output signal is a falling clock-to-Q delay of the flip-flop.

15. Measurement circuitry as claimed in claim 13, wherein the storage unit in each unit cell has its data input set to a logic high value during generation of the oscillating output signal, and the timing information derived from the oscillating output signal is a rising clock-to-Q delay of the flip-flop.

16. Measurement circuitry as claimed in claim 1, wherein each unit cell comprises critical path circuitry connected to the output signal of the storage element, and the timing information derived from the oscillating output signal is a maximum operating frequency indication for an apparatus including the critical path circuitry.

17. An integrated circuit comprising:
processing circuitry incorporating at least one critical path circuit block;
measurement circuitry as claimed in claim 1, wherein each unit cell comprises a copy of one of said at least one critical path circuit blocks connected to the output signal of the storage element, and with the output of said copy being used to determine the clock input signal for an adjacent unit cell of said plurality of unit cells within the ring oscillator; and
operating parameter control circuitry capable of controlling an operating parameter of the processing circuitry in dependence on a frequency of the oscillating output signal generated by the measurement circuitry.

18. An integrated circuit as claimed in claim 17, wherein said operating parameter is an operating frequency.

19. An integrated circuit as claimed in claim 17, wherein each unit cell comprises a copy of the same critical path circuit block.

20. An integrated circuit as claimed in claim 17, wherein said at least one critical path circuit block comprises multiple critical path circuit blocks, and each unit cell comprises a copy of one of said multiple critical path circuit blocks, such that each of said multiple critical path circuit blocks has an associated copy in at least one of the unit cells of the ring oscillator.

21. An integrated circuit as claimed in claim 17, wherein the output of said copy is additionally used to set a data input for an adjacent unit cell of said plurality of unit cells within the ring oscillator to a predetermined value during generation of the oscillating output signal.

22. An integrated circuit as claimed in claim 17, wherein each unit cell includes a bypass path to selectably enable the copy of said at least one critical path circuit block in that unit cell to be bypassed.

23. An integrated circuit as claimed in claim 17, wherein each unit cell includes copies of multiple critical path circuit blocks connected to the output signal of the storage element, and selection circuitry for selecting between those copies so that the output from one of those copies is used to determine the clock input signal for an adjacent unit cell of said plurality of unit cells within the ring oscillator.

24. A method of generating an oscillating output signal used to derive timing information, comprising:
forming a ring oscillator comprising a plurality of unit cells, each unit cell comprising at least a storage element whose output signal is used to determine a clock input signal for an adjacent unit cell of said plurality of unit cells within the ring oscillator;
performing a control operation to control one of a set function and a reset function of the storage element in each of said plurality of unit cells in dependence on set and reset signals input to the control circuitry; and
changing a state of the clock input signal received by the storage element of a first one of said plurality of unit cells in response to an asserted oscillation enable signal, in order to initiate generation of the oscillating output signal;
the performance of the control operation after the generation of the oscillating output signal is initiated controlling a value of the output signal of the storage element in each unit cell so as to cause the oscillating output signal to be maintained.

25. Measurement circuitry for generating an oscillating output signal used to derive timing information, the measurement circuitry comprising:
ring oscillator means comprising a plurality of unit cell means, each unit cell means comprising at least a storage element means whose output signal is used to determine a clock input signal for an adjacent unit cell means of said plurality of unit cell means within the ring oscillator means;
control means for performing a control operation to control one of a set function and a reset function of the storage element means in each of said plurality of unit cell means in dependence on set and reset signals input to the control means; and
oscillation initiation means for changing a state of the clock input signal received by the storage element means of a first one of said plurality of unit cell means upon receipt of an asserted oscillation enable signal, in order to initiate generation of the oscillating output signal;
the control means for performing the control operation after the generation of the oscillating output signal is initiated in order to control a value of the output signal of the storage element means in each unit cell means so as to cause the oscillating output signal to be maintained.

\* \* \* \* \*